United States Patent [19]

Erikson et al.

[11] 4,097,226
[45] Jun. 27, 1978

[54] FURNACE FOR PRACTISING TEMPERATURE GRADIENT ZONE MELTING

[75] Inventors: Carl A. Erikson, Schenectady; John O. Fielding, Ballston Lake; Harvey E. Cline; Thomas R. Anthony, both of Schenectady, all of N.Y.

[73] Assignee: General Electric Company, Schenectady, N.Y.

[21] Appl. No.: 735,513

[22] Filed: Oct. 26, 1976

[51] Int. Cl.² .............................................. F24J 3/00
[52] U.S. Cl. ........................................ 432/120; 34/4; 219/343; 219/405; 432/227; 432/231
[58] Field of Search ............... 432/120, 225, 226, 227, 432/231; 34/4; 219/343, 354, 405, 411

[56] References Cited

U.S. PATENT DOCUMENTS

| | | | |
|---|---|---|---|
| 3,445,662 | 5/1969 | Langley | 219/354 |
| 3,554,512 | 1/1971 | Elliott | 432/227 |
| 3,836,751 | 9/1974 | Anderson | 219/405 |
| 3,858,570 | 1/1975 | Beld et al. | 219/354 |
| 4,001,047 | 1/1977 | Boah | 219/354 |

*Primary Examiner*—John J. Camby
*Attorney, Agent, or Firm*—D. M. Winegar; J. T. Cohen; M. Snyder

[57] ABSTRACT

A furnace for practising temperature gradient zone melting on one or more semiconductor bodies comprises a closable work chamber for receiving semiconductor bodies for processing, a radiant heat source which forms a first closure member and a heat sink which forms a second closure member, the closure members defining the work chamber and being mutually separable by, for example, a hydraulic actuator to allow access to the interior of the work chamber. A reflector is disposed between the heat source and heat sink in surrounding relationship to the semiconductor bodies being processed to ensure the maintenance of a uniform temperature gradient within the work chamber. The reflector and the heat sink are liquid cooled for the effective removal of heat therefrom. The heat sink is further provided with a plurality of radiation attenuating cavities to enhance the performance of the heat sink.

25 Claims, 5 Drawing Figures

FURNACE FOR PRACTISING TEMPERATURE GRADIENT ZONE MELTING

CROSS REFERENCES

This invention relates to the following U.S. Patent applications asssigned to the assignee of the present invention:

Patent application Ser. No. 735,512 filed of even date herewith, in the names of Thomas R. Anthony, Harvey E. Cline, John O. Fielding and Carl A. Erikson, and entitled "Semiconductor Body Heater" which discloses and claims a new and improved heat source for the practise of temperature gradient zone melting;

Patent application Ser. No. 796,367 filed May 12, 1977, in the names of Carl A. Erikson, John O. Fielding, Harvey E. Cline, Thomas R. Anthony and Siegwalt Ludke, and entitled "Apparatus For Practising Temperature Gradient Zone Melting" which discloses and claims an apparatus for a fully automated practise of temperature gradient zone melting and Patent application Ser. No. 796,368, filed May 12, 1977, in the names of Carl A. Erikson, John O. Fielding, Harvey E. Cline, Thomas R. Anthony and Siegwalt Ludke, and entitled "Apparatus For Practising Temperature Gradient Zone Melting" which discloses and claims an apparatus for a fully automated practise of temperature gradient zone melting,

BACKGROUND OF THE INVENTION

1. Field of the Invention

This invention relates to furnaces for processing semiconductor bodies by heat treatment and more specifically for processing semiconductor bodies by temperature gradient zone melting.

2. Description of the Prior Art

In the manufacture of semiconductor devices, it is often necessary to alter or tailor the conductivity type of a body of semiconductor material. This alteration is achieved by distributing atoms of a conductivity modifying dopant in a selected region or selected regions of the body. Frequently, techniques employed to achieve that distribution require the heating of the semiconductor body.

Recently, it has been discovered that a preferred techniques of altering the conductivity of a semiconductor body is the technique of temperature gradient zone melting. Early teachings of temperature gradient zone melting are found in U.S. Pat. No. 2,813,048 issued to W. G. Pfann and in a book by Pfann entitled *Zone Melting* (John Wiley and Sons, Inc., 1966). More recent applications of temperature gradient zone melting are disclosed and claimed in U.S. Pat. Nos. 3,899,361 and 3,899,362 to Thomas R. Anthony and Harvey E. Cline and assigned to the assignee of the present invention. The aforementioned U.S. Patents to Anthony and Cline are incorporated herein by reference. As taught in the aforementioned book by Pfann, temperature gradient zone melting involves the migration of a melt of a first material through a body of a second material under the influence of a temperature gradient maintained across the second material and finally a recrystallization of the melt after migration. In the application of temperature gradient zone melting to the production of semiconductor devices, the first material usually comprises a metal such as aluminum, tin-aluminum alloy or gold-antimony alloy while the second material comprises a semiconductor material such as silicon, germanium or the like.

In his copending U.S. patent application Ser. No. 578,736, filed May 19, 1975, now U.S. Pat. No. 4,041,278, and entitled "Heating Apparatus For Temperature Gradient Zone Melting" John Boah discloses a furnace suitable for the manufacture of semiconductor devices by temperature gradient zone melting. However, it was found that the Boah apparatus could be improved upon in a number of respects. A new and improved heater useful in such a furnace is disclosed and claimed in the aforementioned U.S. patent application Ser. No. 735,512 incorporated herein by reference. This heater provides a heat output capability commensurate with a large scale commercial manufacture of semiconductor devices, the temperature gradient across an array of semiconductor devices heated by this heater being of a uniformity sufficient to ensure consistency in the simultaneous production of a plurality of semiconductor devices. Such a capability for a large scale commercial manufacture of semiconductor devices is therefore required of components of a furnace employed with such a new and improved heater. To achieve this capability the work chamber of the furnace must be large enough to accommodate a plurality of semiconductor devices equal in number to those which the aformentioned semiconductor body heater is capable of simultaneously heating. Furthermore, the furnace must lend itself to an automated loading and unloading of semiconductor devices. Therefore, the work chamber or interior of the furnace must be readily accessible by an automated semiconductor body loader and unloader. Moreover, to achieve this large scale commercial manufacture capability, the work chamber must possess the capability to be opened and closed quickly. To minimize maintenance and the risk of failure, simplicity in operation and construction is desirable.

Critical to the successful implementation of temperature gradient zone melting in the manufacture of semiconductor devices is the maintenance of a unidirectional temperature gradient across the semiconductor material. This, for any desired direction of migration of the conductivity altering dopant through a body or wafer of semiconductor material, a temperature gradient across the body should be established in a direction as close to the desired direction as possible. The existence of temperature gradients in any other directions (lateral or oblique to the major surfaces of the wafer) will cause the migration of the dopant in these other directions thereby causing the resulting melt zone to be irregular or misdirected. Such zone geometries adversely affect the performance of the semiconductor device. To establish a temperature gradient across a plurality of bodies of semiconductor material heated by, for example, the heater disclosed and claimed in the aforementioned U.S. Patent application, heat must be removed from the work chamber. In the large scale commercial manufacture of semiconductor devices, large quantities of heat must be removed from the work chamber, and must be removed in such a way as to avoid the creation of lateral or transverse temperature gradients within the semiconductor bodies. Moreover, the heat should be removed as effectively as possible to maximize the temperature gradient within the semiconductor bodies thereby minimizing the time required for the temperature gradient zone melting process.

Therefore it is an object of the present invention to provide a new and improved furnace for practising temperature gradient zone melting, which furnace overcomes the deficiencies of the prior art.

It is another object of the present invention to provide a new and improved furnace for practising temperature gradient zone melting, which furnace is capable of simultaneously handling a multiplicity of semiconductor bodies.

It is another object of the present invention to provide a new and improved furnace for practising temperature gradient zone melting, the interior of which is readily accessible by an automated semiconductor body loader and unloader.

It is another object of the present invention to provide a new and improved furnace for practising temperature gradient zone melting, which furnace includes means for the effective and uniform removal of heat from a work chamber of the furnace.

SUMMARY OF THE INVENTION

These and other objects apparent from the following detailed description taken in connection with the appended claims and accompanying drawings are attained by providing a furnace for practising temperature gradient zone melting on one or more semiconductor bodies with a radiant heat source and a heat sink. The heat source comprises a first closure member and the heat sink comprises a second closure member, the two closure members defining a closable work chamber. The closure members are mutually separable by, for example, a hydraulic actuator to allow access to the interior of the work chamber. A reflector is disposed between the heat source and heat sink in surrounding relationship to the semiconductor bodies being processed to insure the maintenance of a uniform temperature gradient within the work chamber. The reflector and the heat sink are liquid cooled for the effective removal of heat therefrom. The heat sink is further provided with a plurality of radiation attenuating cavities to enhance the performance of the heat sink.

DESCRIPTION OF THE PREFERRED EMBODIMENT

Figure 1:
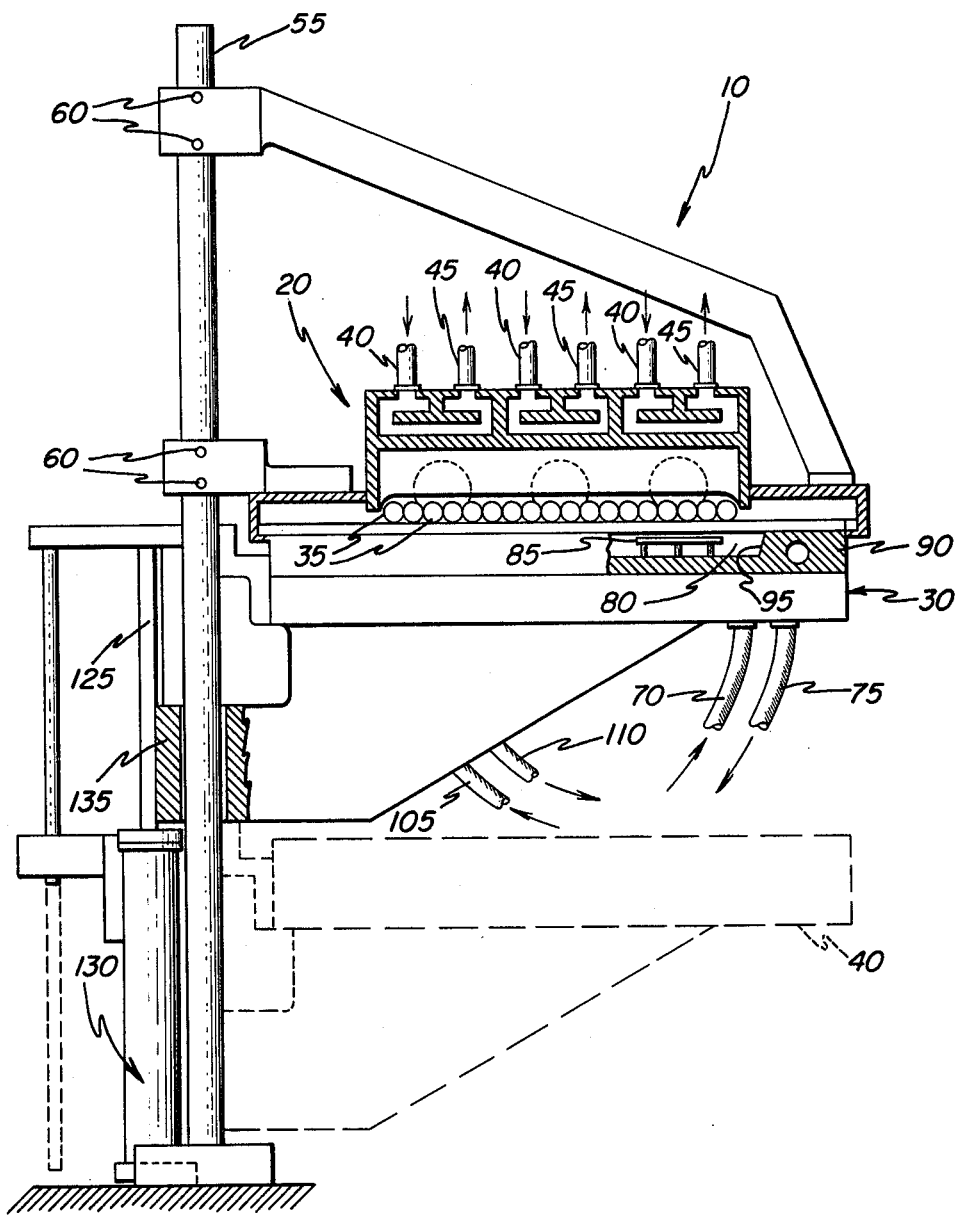
FIG. 1 is a side view partially sectioned and broken away of the furnace of the present invention.
Figure 2:
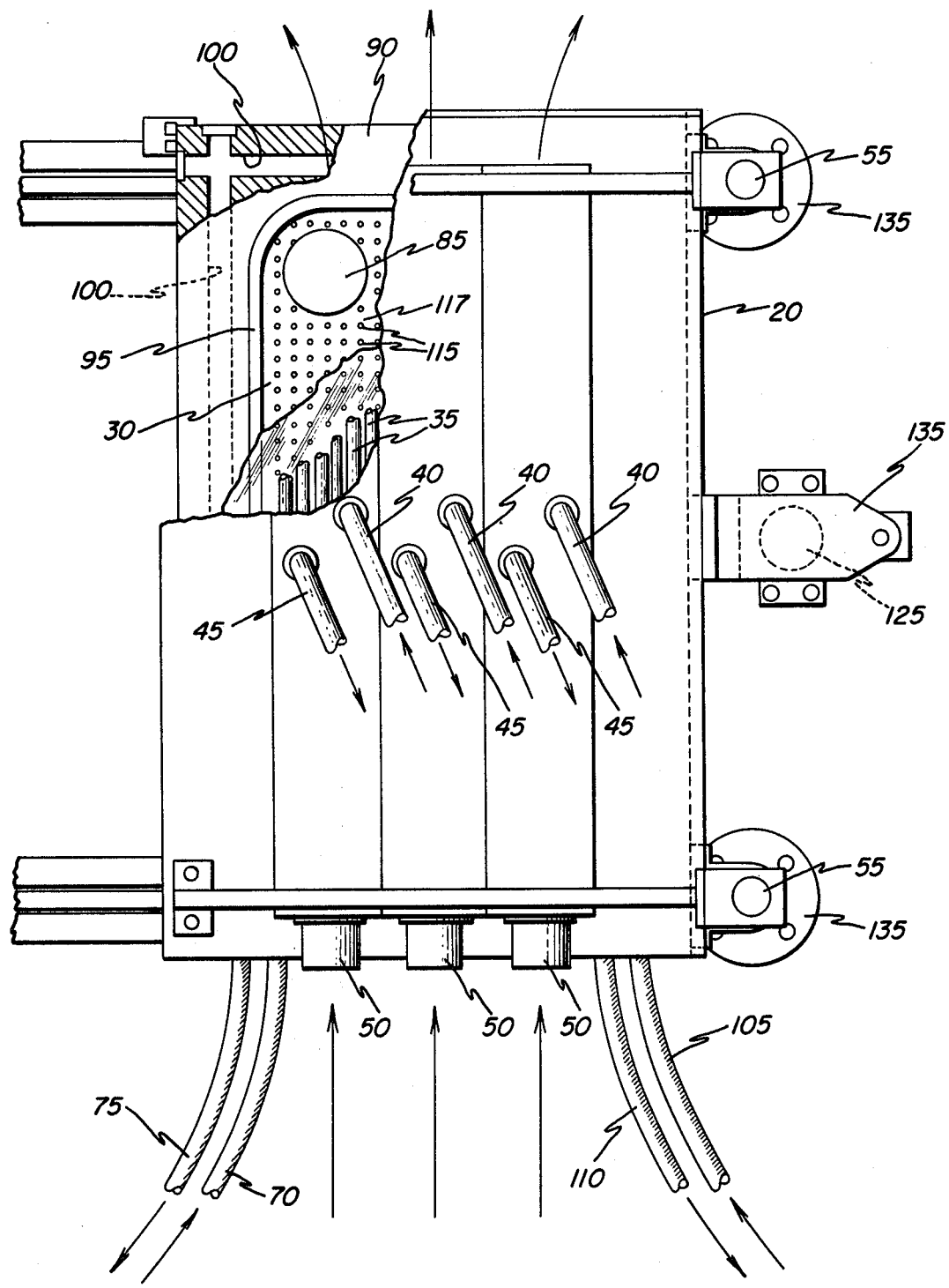
FIG. 2 is a top view partially sectioned and broken away of the furnace of the present invention.

Referring generally to FIGS. 1 and 2 there is shown a furnace 10 comprising a heat source or first closure member 20 and a heat sink or second closure member 30. Heat source 20 includes a plurality of heating elements 35 such as tungsten filament infrared lamps. Such lamps are capable of emitting infrared radiation of a temperature as high as 3000° C. The heat source is cooled by flows of liquid coolant and cooling gas therethrough. Liquid coolant is supplied to the heat source via supply conduits 40 and is drained therefrom through drain conduits 45. Cooling gas, such as compressed air, is supplied to heat source 20 through air inlet tubes 50, cools the lamp envelopes and the envelope seals and is discharged from an opposite side of the heat source. The details of construction of the heat source form no part of the present invention and are disclosed and claimed in the aforementioned U.S. Pat. application Ser. No. 735,512 incorporated herein by reference. First closure member 20 is fixed to vertical rails 55 at 60.

Figure 3:
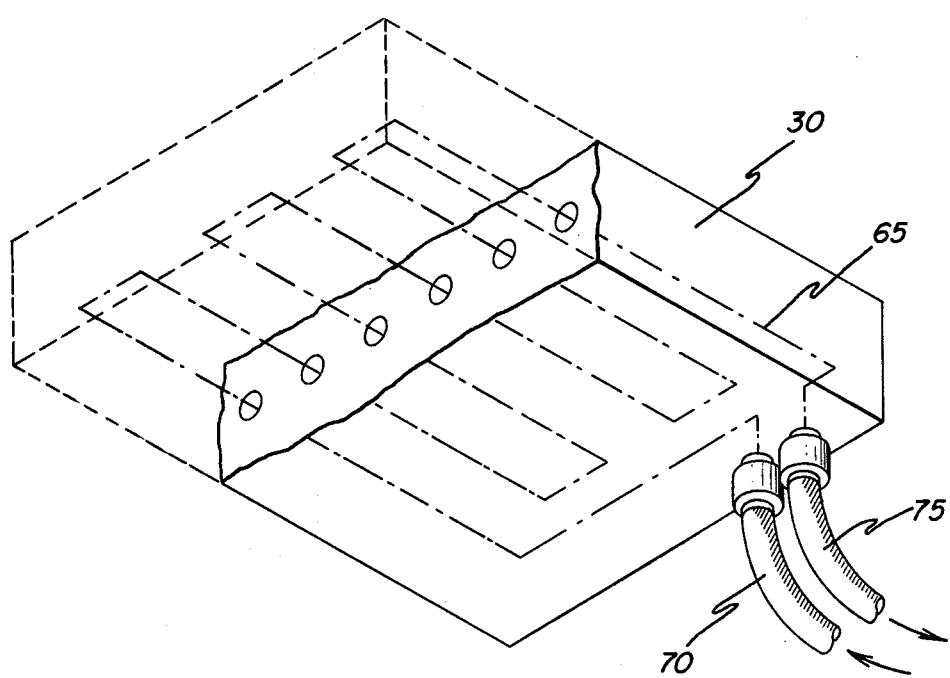
FIG. 3 is a three-dimensional view partially broken away of a heat sink employed in the furance of the present invention.
Figure 4:
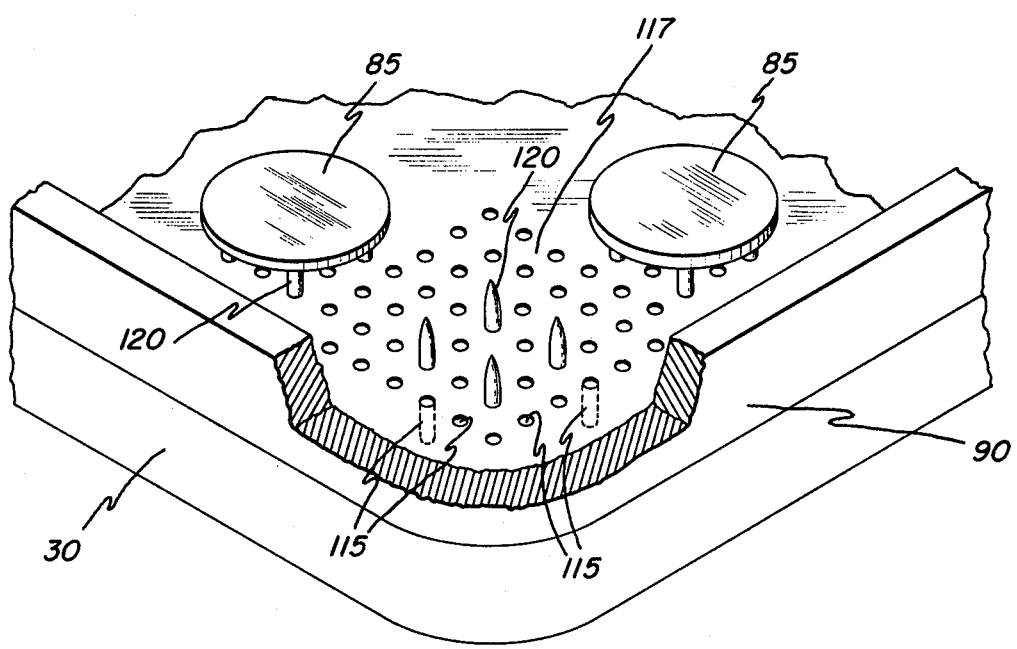
FIG. 4 is a three-dimensional view partially sectioned and broken away of a portion of the heat sink, a reflector employed in the furnace of the present invention and means for supporting semiconductor wafers within the furnace.

Heat sink 30 comprises a substantially flat plate having a serpentine cooling passage 65 in the interior thereof (See FIG. 3). Although a serpentine coolant passage is illustrated herein, it will be appreciated by those skilled in the art that coolant passages of other configurations may be employed. Heat sink 30 may also be cooled by contacting a major surface thereof with coolant or with a conduit through which coolant flows. In the preferred embodiment liquid coolant is supplied to heat sink 30 through supply tube 70 and is drained from heat sink 30 through a drain tube 75. A liquid cooled heat sink such as heat sink 30 provides an effective means for removing heat from the furnace of the present invention and in cooperation with heat source 20, creates a uniform temperature gradient (in a vertical direction as viewed in FIG. 1) across semiconductor bodies being processed by the furnace.

First and second closure members 20 and 30 define in part a closable work chamber 80 which receives semiconductor bodies 85 therein for processing. Heat source 20 and heat sink 30 face internally of the work chamber. Work chamber 80 is further defined by reflector 90 which may be formed integrally with second closure member 30 and is disposed between heat source 20 and heat sink 30 in surrounding relation to semiconductor bodies 85. Reflector 90 includes a reflective surface 95 generally facing heat source 20 and bodies 85 of semiconductor material and is disposed at an angle of between 5° and 25° from a normal to the major surface of the heat sink facing the heat source. Preferably, this angle is approximately 15° from the aforementioned normal. Infrared radiation from heat source 20 is reflected by surface 95 toward semiconductor bodies 85 to enhance the uniformity of the temperature gradient across those bodies disposed closest to the sides of work chamber 80. In this manner, lateral or transverse gradients in these locations due to the finite size of heat source 20 are substantially eliminated. In the preferred embodiment, reflector 90 is formed from aluminum or other suitable metal polished at surface 95 and is provided with a coolant passage 100 in the interior thereof. Coolant is supplied to passage 100 through supply pipe 105 and is drained from passage 100 through drain pipe 110. However, reflector 90 may also be formed from quartz or other suitable refractory material having a gold reflective surface plated thereon.

It has been discovered that when semiconductor bodies 85 are irradiated with infrared radiation from heat source 20, the bodies will themselves emit to heat sink 30. To enhance the effectiveness of the removal of heat by heat sink 30 and therefore to increase the magnitude of the temperature gradient across semiconductor bodies 85, heat sink 30 is provided with a multiplicity of radiation attenuating cavities 115 disposed in a major surface 117 of the heat sink facing heat source 20. Radiation incident on that surface and entering cavities 115 will be repeatedly reflected within the interiors of the cavities to the extent of substantially complete attenuation. In the preferred embodiment cavities 115 are cylindrical in shape, the depth of the cavities being at least three times as long as the cavity diameters. Semiconductor body supports 120 comprising pointed quartz pins are receivable within cavities 115. Members 120 support semiconductor bodies 85 within work chamber 80 while conducting only insignificant amounts of heat from semiconductor bodies 85 to heat sink 30. This minimal conduction of heat away from semiconductor bodies 85 does not significantly affect the maintenance of a uniform temperature gradient across the bodies. Additionally, to further enhance the temperature gradient across the semiconductor bodies, major surface 117 may be coated on selected portions thereof with a radiation absorbing coating. A coating of carbon has been found to be particularly useful for this purpose.

To allow access to the interior of work chamber 80 by suitable automated semiconductor wafer loading and unloading apparatus (now shown) closure member 30 is fixed to a piston rod 125 of an actuation means 130 through bracket 133. Actuation means 130 may be of any suitable variety, hydraulic, pneumatic or hydro-pneumatic actuators well known to those skilled in the art being particularly well suited for this application. Closure member 30 includes bearings 135 in which rails 55 are slidably received. Actuation means 130 rectilinearly moves closure member 30 into a furnace open position (shown by phantom lines at 140) allowing the automated loading and unloading apparatus to gain ingress to and egress from the interior of the furnace while rails 55 maintain the alignment of closure member 30 with closure member 20.

Figure 5:
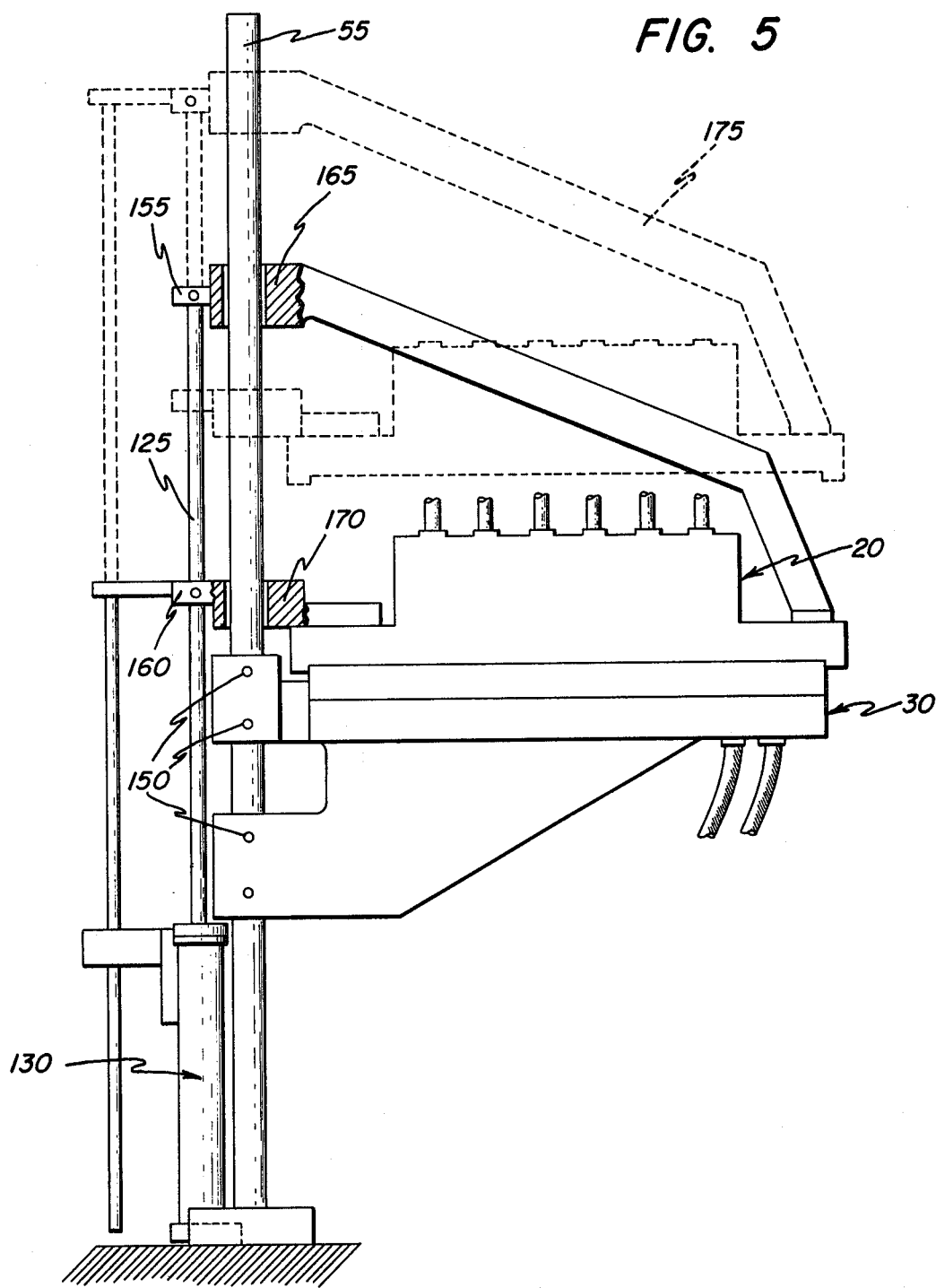
FIG. 5 is a side view partially sectioned and broken away of an alternate embodiment of the furnace of the present invention.

Referring now to FIG. 5, there is shown an alternate embodiment of the furnace of the present invention. Should it be desirable to move closure member 20 while maintaining closure member 30 stationary, closure member 30 may be fixed to rails 55 at 150 and closure member 20 may be fixed to piston rod 125 of actuation means 130 at 155 and 160. First closure member 20 is provided with bearings 165 and 170 which receive rails 55. In this arrangement, actuation means 130 will open and close the furnace by rectilinearly moving first closure member 20. First closure member 20 is shown in a furnace open condition in phantom lines at 175. Details of construction of the heat source, heat sink and reflector are the same as those illustrated in FIGS. 1-4.

It can be seen then that the furnace of the present invention is particularly well suited for the large scale manufacture of semiconductor devices by temperature gradient zone melting. The furnace may be sized to accommodate a large number of semiconductor bodies. The interior of the furnace is readily accessible by automated loading and unloading apparatus. The heat sink employed in the furnace of the present invention effectively removes heat from the furnace to enhance the temperature gradient across the semiconductor bodies and with the reflector, maintains the uniformity of the temperature gradient across the semiconductor bodies in the work chamber of the furnace.

While there have been shown and described two embodiments of the furnace of the present invention, it will be apparent to those skilled in the art that modifications may be made without departing from the substance of the invention and it is intended by the appended claims to cover such modifications as come within the spirit and scope of this invention.

What is claimed is:

1. An apparatus for the simultaneous processing of one or more bodies of semiconductor material by temperature gradient zone melting, said apparatus comprising:
   a closable work chamber for receiving said semiconductor bodies for processing;
   a radiative heat source facing internally of said work chamber, said heat source comprising a first closure member for said work chamber;
   a heat sink provided with a multiplicity of closely packed radiation attenuating cavities disposed in a major surface thereof facing internally of said work chamber and located opposite to, and facing, said heat source whereby when radiation is emitted from said heat source to said cavities the radiation is repeatedly reflected within the interiors of said cavities to the extent of substantially complete attenuation, said heat sink comprising a second closure member for said work chamber;
   said closure members defining at least in part said work chamber and at least one of said closure members being movable to allow access to the interior of said work chamber, and
   means disposed in said work chamber for supporting said bodies of semiconductor material.

2. The apparatus of claim 1 and further including an actuation means, said actuation means being operatively connected to said first and second closure members and providing relative movement between said first and second closure members to effect opening and closing of said work chamber.

3. The apparatus of claim 2 wherein said first closure member is stationary and said second closure member is moveable by said first actuation means into and out of closing engagement with said first closure member.

4. The apparatus of claim 2 wherein said second closure member is stationary and said first closure member is moveable by said first actuation means into and out of closing engagement with said second closure member.

5. The apparatus of claim 2 wherein said actuation means comprises an hydraulic actuator.

6. The apparatus of claim 2 wherein said actuation means comprises a pneumatic actuator.

7. The apparatus of claim 2 wherein said actuation means comprises a hydro-pneumatic actuator.

8. The apparatus of claim 1 wherein said radiative heat source emits radiation of a temperature as high as 3000° C.

9. The apparatus of claim 1 wherein said radiative heat source comprises a plurality of infrared emitting lamps.

10. The apparatus of claim 1 wherein said heat sink comprises a fluid cooled substantially flat plate.

11. The apparatus of claim 10 wherein said heat sink is provided with a coolant passage in the interior thereof.

12. The apparatus of claim 11 wherein said coolant passage is of a serpentine configuration.

13. The apparatus of claim 10 and further including a radiation absorbing coating disposed on selected portions of a surface of said heat sink facing said heat source.

14. The apparatus of claim 13 wherein said coating comprises carbon.

15. The apparatus of claim 1 wherein said radiation attenuating cavities are cylindrical in shape, the depth of said cavities being at least three times greater than the diameter of said cavities.

16. The apparatus of claim 1 wherein said heat sink comprises a substantially flat plate having a serpentine arrangement of coolant passages in the interior thereof.

17. The apparatus of claim 1 wherein said semiconductor body supporting means are receivable within any of said radiation attenuating cavities.

18. The apparatus of claim 1 and further including a reflector disposed between said heat source and said heat sink in surrounding relationship to said one or more bodies of semiconductor material, said reflector having a reflective surface serving to direct heat from said heat source toward said one or more bodies of semiconductor material.

19. The apparatus of claim 18 wherein said reflector is formed from a refractory material and said reflective surface is of gold.

20. The apparatus of claim 19 wherein said refractory material is quartz.

21. The apparatus of claim 18 wherein said reflective surface is of polished metal.

22. The apparatus of claim 21 wherein said reflective surface is of polished aluminum.

23. The apparatus of claim 18 wherein said reflective surface generally faces said heat source and is disposed at an angle of between 5° and 24° from a normal to a major surface of said heat sink facing said heat source.

24. The apparatus of claim 22 wherein said angle is of approximately 15°.

25. The apparatus of claim 17 wherein said reflector is provided with a coolant passage in the interior thereof.

* * * * *